United States Patent
Bulus (10) Patent No.: US 12,401,123 B2
(45) Date of Patent: Aug. 26, 2025

(54) ANTENNA DESIGN HARDWARE

(71) Applicant: ANTENOM ANTEN TEKNOLOJILERI A.S., Ankara (TR)

(72) Inventor: Umut Bulus, Ankara (TR)

(73) Assignee: ANTENOM ANTEN TEKNOLOJILERI A.S., Ankara (TR)

( * ) Notice: Subject to any disclaimer, the term of this patent is extended or adjusted under 35 U.S.C. 154(b) by 1127 days.

(21) Appl. No.: 17/285,463

(22) PCT Filed: Nov. 27, 2019

(86) PCT No.: PCT/TR2019/050999
§ 371 (c)(1),
(2) Date: Apr. 14, 2021

(87) PCT Pub. No.: WO2020/112065
PCT Pub. Date: Jun. 4, 2020

(65) Prior Publication Data
US 2021/0384631 A1  Dec. 9, 2021

(30) Foreign Application Priority Data
Nov. 27, 2018  (TR) .................. 2018/17965

(51) Int. Cl.
*H01Q 9/04* (2006.01)
*H01Q 13/02* (2006.01)
*H01Q 21/00* (2006.01)

(52) U.S. Cl.
CPC ....... *H01Q 9/0407* (2013.01); *H01Q 13/0283* (2013.01); *H01Q 21/0087* (2013.01)

(58) Field of Classification Search
CPC ............. H01Q 9/0407; H01Q 13/0283; H01Q 21/0087
See application file for complete search history.

(56) References Cited

U.S. PATENT DOCUMENTS

2005/0078046 A1  4/2005  Theobold
2011/0251832 A1  10/2011  Schoeber et al.
(Continued)

FOREIGN PATENT DOCUMENTS

| | | |
|---|---|---|
| CN | 104239634 | 6/2017 |
| JP | 2012182550 A * | 9/2012 |

OTHER PUBLICATIONS

Wikipedia contributors, 'SMA connector', Wikipedia, The Free Encyclopedia, May 16, 2024, 02:04 UTC, <https://en.wikipedia.org/w/index.php?title=SMA_connector&oldid=1224071138> [accessed Jun. 1, 2024] (Year: 2024).*

(Continued)

*Primary Examiner* — Livius R. Cazan
(74) *Attorney, Agent, or Firm* — Crose Law LLC; Bradley D. Crose (57) ABSTRACT

The invention relates to an antenna design hardware, which both allows antenna designers to realize antenna design in any geometry that they desire and also allows antenna users to build antenna that they desire, and which allows various antenna types to be built by using pieces designed in cell form. Cell is the general name given to the parts in any geometric shape that can form antenna. The invention particularly relates to antenna design hardware which allows for building antenna three-dimensionally and forming antenna design by integrating metal, dielectric, electromagnetic absorber cells and using connectors.

15 Claims, 6 Drawing Sheets

(56) References Cited

U.S. PATENT DOCUMENTS

2016/0218425 A1     7/2016   Mohamadi
2017/0149120 A1     5/2017   Zimmerman et al.

OTHER PUBLICATIONS

M. I. M. Ghazali, E. Gutierrez, J. C. Myers, A. Kaur, B. Wright and p. Chahal, "Affordable 3D printed microwave antennas," 2015 IEEE 65th Electronic Components and Technology Conference (ECTC), San Diego, CA, USA, 2015, pp. 240-246, doi: 10.1109/ECTC.2015.7159599. (Year: 2015).*

* cited by examiner

ANTENNA DESIGN HARDWARE

RELATED TECHNICAL FIELD OF THE INVENTION

The invention relates to an antenna design hardware, which both allows antenna designers to realize antenna design in any geometry that they desire and also allows antenna users to build antenna that they desire, and which allows various antenna types to be built by using pieces designed in cell form.

The invention particularly relates to antenna design hardware which allows for building antenna three-dimensionally and forming antenna design by integrating metal, dielectric, electromagnetic absorber cells and using connectors.

STATE OF THE ART

The antenna is a transducer that converts current and voltage on an electronic circuit into electromagnetic radiation, or converts electromagnetic radiation into current and voltage. Transmitting antenna converts current and voltage into electromagnetic radiation and receiving antenna converts electromagnetic radiation into current and voltage. Antenna design is realized according to many parameters such as operating frequency band, polarization, impedance, gain, size, weight, half-power beam width, side lobe level and back lobe level etc.

In projects which require antenna, first the antenna requirements of the project are determined. According to these requirements, literature research and theoretical studies are conducted. Then, the antenna that is intended to be implemented is simulated in computer based antenna design programs. As a result of these simulations, the materials required for the designed antenna are ordered. Prototype productions are performed with related materials and prototypes are measured. If the measurements are not compatible with the simulation results and the desired design, the simulation step is returned and the design, order, prototype production and measurement steps are repeated. While typically the final result cannot be achieved at once, process steps starting from the simulation step are repeated for several times. This leads to high costs of antenna design. When the measurements meet the requirements, antenna production and documentation is made, and the project is done.

In the state of the art methods, the antennas are developed as single part or as various parts that may form a single antenna. For example, reflector antennas which have the dimensions to be used for TV, also known as dish antennas, are made by pressing a metal sheet.

Reflector antennas having several meters long are produced in smaller parts each of which are same with one another and can be combined together. Some antennas are manufactured by CNC production method, wherein others are manufactured by the methods of casting, printing on circuit board and etc.

In the state of the art, antennas having various features are sold as products. Users select and purchase the antenna that they can use in their applications by examining the datasheets which shows the features of products. Thus, they obtain the antennas required for their research. In each new project, antenna requirements change and users would have to buy new antennas.

In the state of the art, kits consisting of ready-to-use antennas are used to teach various features of the antennas in antenna trainings. Gain, polarization, impedance, bandwidth, reflection coefficient, size, weight, half-power beam width, side lobe level, back lobe level and etc. are described on these antennas. Thus, people taking antenna trainings learn various parameters of the antenna but do not design the antenna.

Antenna design or analysis software which works in computer environment can also be used in trainings. These simulation programs allow for making antenna design by modeling the physical world in computer environment. Those who receive antenna training can build antennas in computer environment by using these programs and see the results of these antennas again in computer environment. The institutions having the infrastructure to produce antennas can realize the antenna which is obtained in the simulation environment in undergraduate/graduate/doctoral courses and undergraduate/graduate/doctoral theses and allow the participants to see an antenna design process from the beginning to the end. However, these infrastructures are present in limited institutions. Furthermore, one-semester courses are too short to learn these simulation programs. Even if it is learned, these simulation programs are at a price per computer. Besides, the antennas produced by the participants create unnecessary costs.

After preliminary research about the state of the art, the patent document numbered "CN104239634" has been examined. The subject matter invention discloses an antenna design method used for acquiring parameters of a target antenna, acquiring an interpolation combination of the parameters of the target antenna by using orthogonalization experiment design, obtaining a performance index of the interpolation combination through a simulation model.

After preliminary research about the state of the art, the patent document numbered "US20110251832" has been examined. The subject matter invention discloses a method providing in particular analysis and/or optimization of an antenna radiation problem and being used for determining an electromagnetic near-field of an electrical system.

In the state of the art, researchers who are antenna users purchase a different antenna in every new project to meet the antenna requirements of the respective project. This brings along new costs to each project they work on. In addition to the costs, there is a waiting period after each antenna purchase order until the delivery. Moreover, some antenna parameters are taught by using ready-to-use antennas in antenna trainings. However, there is no hardware allowing to teach antenna design in those. In the trainings given in institutions having production infrastructure, an antenna design is made using simulation programs and this design is sent to production and its results are observed. However, not all universities or educational institutions have these opportunities. Antenna training costs are high in educational institutions where these opportunities are provided. Antenna design cannot be made in antenna training in educational institutions where these opportunities are not provided. There are many simulation programs for antenna design and generally the final antenna design can be achieved by means of several prototype production of physical structures obtained by using these programs. This causes the antenna design costs to increase and antenna design duration to extend.

As a result, due to the above-mentioned problems and because of the inadequacy of the existing solutions, it is deemed necessary to make an improvement in the related technical field.

OBJECT OF THE INVENTION

The most important object of the invention is that it allows antenna designers to design antennas that they desire by means of the feature of antenna designing ability by combining the cells, and allows antenna users to obtain antennas with features that they desire by means of the feature of antenna creation by combining the cells. The desired geometry can be created three-dimensionally by combining the cells. Thus, the antenna in the obtained geometry can be used either for design, or for usage by building the antenna, or for antenna training.

Another significant object of the invention is to achieve the desired antenna dimensions practically by using metal, dielectric, electromagnetic absorber cells. Thus, instead of producing many prototypes to achieve the final electromagnetic properties of the antenna, these properties can be achieved by using metal, dielectric and electromagnetic absorber cells.

A further object of the invention is to allow for performing antenna design without using simulation programs. It eliminates one step in antenna design by performing antenna design on the antenna analyze device (network analyzer) by using directly the cells without using any antenna design or analysis software.

Another aim of the invention is that it reduces the costs of antenna prototype production and final product production by means of using the cells to build the physical structure of the antenna obtained in designs performed by using antenna simulation programs. Furthermore, waiting period for prototype or final antenna production are reduced.

A further aim of the invention is that it enables the cells to be disassembled and to build a new antenna according to the new requirements when the antenna requirements change.

Another aim of the invention is that it enables performing antenna designs using metal, dielectric and electromagnetic absorber cells. By this measure, as the cells have a detachable structure, the users will be able to build many antennas, particularly in the training area. Thus, antenna design can be performed practically in antenna trainings. This will both improve the quality of antenna training and reduce training costs.

Another object of the invention is that it enables the design to be performed very quickly, and that it needs no computer, and that it has an advantage over simulation programs in terms of instantly showing certain effects that are not seen in simulation programs but seen in prototyping stages.

Structural and characteristic specifications and all advantages of the invention will be understood more clearly by means of following figures and detailed descriptions written by referencing to those figures. Therefore, assessment should be done by taking these figures and detailed description into consideration.

REFERENCE NUMBERS

101. Cell Protrusion
102. Cell Body
110. Conductive Cell
120. Dielectric Cell
140. Connector
141. Connector Body
142. Connector Dielectric
143. Connector Inner Conductor
144. Connector Protrusion
145. Connector Hole
150. Conductive Ground Plane
151. Ground Plane Protrusion
200. Patch Antenna Used in the State of the Art
210. Patch Used in the State of the Art
220. Patch Antenna Dielectric Used in the State of the Art
230. Patch Antenna Ground Plane Used in the State of the Art
240. Connector Used in the State of the Art
300. Horn Antenna Used in the State of the Art
10. Determination of antenna requirements
11. Determination of antenna type
12. Calculations according to antenna type and requirements
13. Determination of cell types and number of cells to be used according to calculations
14. Placement of conductive cells to be used according to calculations
15. Selection of the connector
16. Mounting the connector
17. Measuring whether the antenna structure meets the antenna requirements
18. Checking whether the antenna requirements are met nor not
19. Completion of the Design
20. Checking if the conductive ground plane is used
21. Not placing the conductive ground plane if not used
22. Placing the conductive ground plane if used
30. Checking if the electromagnetic absorber cell is used
31. Not placing the electromagnetic absorber cell if not used
32. Placing the electromagnetic absorber cell if used
40. Checking if the dielectric cell is used
41. Not placing the dielectric cell if not used
42. Placing the dielectric cell if used

DESCRIPTION OF THE INVENTION

The subject matter antenna design hardware mainly consists of conductive cell (110), dielectric cell (120), electromagnetic absorber cell, conductive ground plane (150) and connector (140). Cells are used to build various antenna types. Three types of cells as conductive cell (110), dielectric cell (120), electromagnetic absorber cell are used in the subject matter antenna design hardware. Cell is the general name given to the parts in any geometric shape that can build antenna.

The subject matter antenna design hardware consists of conductive cell (110), dielectric cell (120), electromagnetic absorber cell, conductive ground plane (150) which are able to build more than one type of antennas according to requirements of operating frequency band, polarization, impedance, gain, size, weight, half-power beam width, side lobe level and back lobe level.

Conductive cells (110) are used to form conductive parts of the conventional antennas by means of their conductivity properties. The electrically conducting conductive cells (110) can be made from conductive plastics, metals or metal coated plastics. The conductive cells (110) can also operate by not contacting or by contacting each other from one or more points or all along the surface of the cell body (102) or by contacting the cell protrusion (101).

The conductive cell (110), the dielectric cell (120), the electromagnetic absorber cell and the conductive ground plane (150) used in the subject matter antenna design hardware have a structure that can be connected by one or more of the methods of interlocking, screwing, bonding, soldering, welding.

Contactless operation is achieved by means of the fact that the conductive cells (110), which are mechanically separate and do not contact each other, electromagnetically act as a single conductive plate at RF frequencies. The conductors are prevented from contacting each other by leaving some space between them, placing non-conductive materials between them, or coating the conductors with non-conductive materials. Conductive materials having different conductivity may also be used between conductive cells (110). The cells that do not contact each other as DC (Direct Current) excite each other at RF (Radio Frequency) frequencies and behave such as a unity and achieve to operate as an antenna. In parasitic antennas, a metal piece placed next to an antenna operating at a certain frequency provides this antenna to operate at an additional different frequency. However, contactless operation feature of the conductive cells (110) comprises the fact that an antenna consists of components not contacting each other. Even if a portion of the conductive cells (110) contact to each other and another portion does not contact, the antenna operates by the principle that all the conductive cells (110) contacting or not contacting each other form a single antenna. Furthermore, the use of conductive cells (110) having one or more than one conductivity value will provide flexibility in antenna design.

The dielectric cells (120) can operate by contacting each other from one or more points or along the entire surface of the cell body (102) or by contacting the cell protrusion (101). Contactless operation is achieved by means of the fact that the dielectric cells (120), which are mechanically separate from each other and do not contact each other, behave as a single dielectric plate electromagnetically at RF frequency. The dielectric materials are prevented from contacting each other by leaving some gap between them or placing dielectric material having different electricity properties between them. Dielectric cells (120), which do not contact each other or only contact at one or several points, act as one-piece at RF frequencies. In this case, effective dielectric permittivity values may be lower compared to dielectric structures in one piece.

The subject matter antenna design hardware can involve dielectric cells (120) consisting of one or more than one dielectric material. In conventional antenna designs, antenna design is made on one type of dielectric material, whereas by means of the subject matter antenna design hardware, in an antenna, dielectric cells (120) having different dielectric permittivities can be used in the same layer. This feature makes it possible to make a patch antenna consisting of, for example, dielectric cells with dielectric constants of 3, 5 and 10 in a single layer. Thus, the frequencies at which the antenna can operate are not limited to the step interval of the cell dimensions, namely to increasing the size of the antenna by at least one cell size. Inside of an antenna, by using dielectric cells (120) with different dielectric constants at the same layer, the subject matter antenna design hardware is enabled to operate at all interval frequencies. Moreover, use of different dielectric cells (120) can be provided both on the same layer and on different layers.

Electromagnetic absorber cells act as a single absorber plate electromagnetically at RF frequency without contacting each other although they are mechanically separate. The electromagnetic absorber cells absorbing the electromagnetic wave can be obtained from various materials such as absorbing paint, foam, sponge, plastic, carbon or metal having low conductivity value. The electromagnetic absorber cells can operate by contacting each other from one or more points or along the entire surface of the cell body (102) or by contacting the cell protrusion (101). Contactless operation is achieved by means of the fact that the electromagnetic absorber cells, which are mechanically separate and do not contact each other, behave as a single absorber plate electromagnetically at RF frequencies. The electromagnetic absorber cells are prevented from contacting each other by leaving some gap between them or using a material having different electricity properties. The absorption and reflection properties of the electromagnetic absorber cells may vary depending on the type and material of the electromagnetic absorber cell used.

Figure 4:
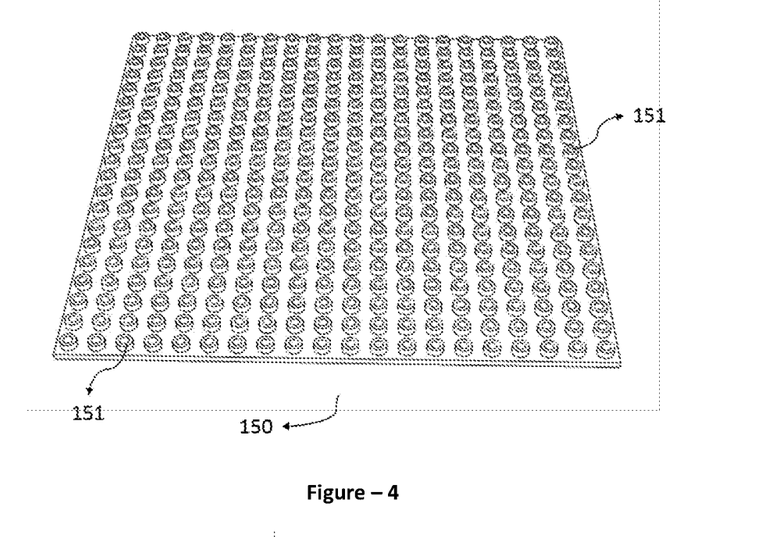
FIG. 4; The drawing showing the view of subject matter antenna design hardware ground plane.

The conductive ground plane (150) is used as one or more piece according to the properties and dimensions of the designed antenna. The conductive cell (110), the dielectric cell (120), the electromagnetic absorber cell and the connector (140) are connected with the conductive ground plane (150). The conductive ground plane (150) may be made from conductive plastics, metals or metal coated plastics. The conductive ground plane (150) having shape of a cell, can form a larger conductive ground plane (150) by being combined with the conductive cells (110), or conductive ground planes (150). In this case, the conductive ground plane (150) and the conductive cells (110) or the conductive ground plane (150) and the other conductive ground plane (150) or the conductive cells (110) and the conductive cells (110) can operate by contacting from one or several points or all along the surface or contactlessly. Contactless operation is achieved by means of the fact that the conductive ground plane (150), which mechanically do not contact each other, electromagnetically behave as a single piece at RF frequencies. The conductors are prevented from contacting each other by leaving some space between them or using non-conductive materials. The cells which do not contact each other as DC (direct current), ensure to operate as a conductive ground plane (150) by exciting each other as RF. The conductive ground plane (150) is used with or without holes thereon. Thereby, users are able to drill holes on the holeless conductive ground plane (150) when desired. Inner side of the holes may be threaded or hollow for mounting the RF connectors (140).

Figure 1:
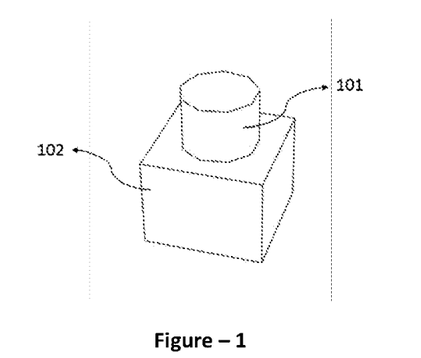
FIG. 1; The drawing showing the view of subject matter antenna design hardware cell.
Figure 2:
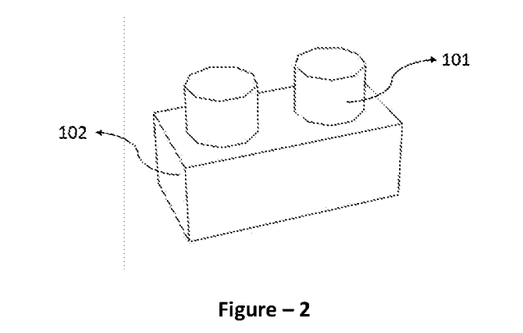
FIG. 2; The drawing showing the view of subject matter antenna design hardware cell.
Figure 3:
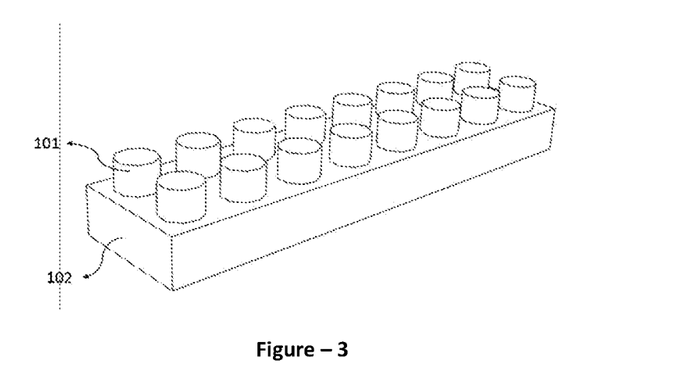
FIG. 3; The drawing showing the view of subject matter antenna design hardware cell.

The conductive cells (110), dielectric cells (120) and the electromagnetic absorber cells can have 1×1, 1×2, 2×8 sizes as can be seen in FIG. 1, FIG. 2 and FIG. 3 and any similar size and any kind of 3 dimensional geometrical shape.

Figure 5:
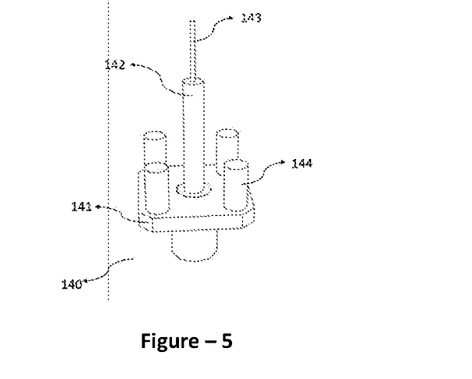
FIG. 5; The drawing showing the view of interlocking connector used in the subject matter antenna design hardware.
Figure 6:
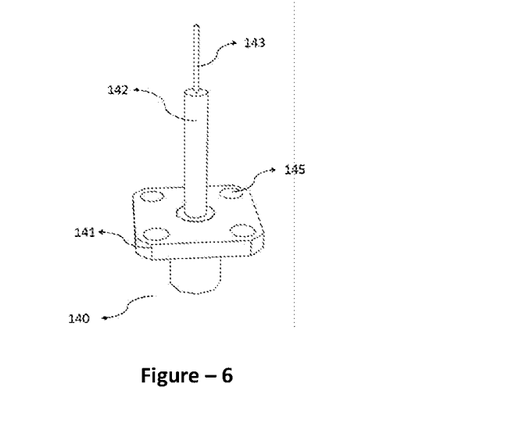
FIG. 6; The drawing showing the view of screw connector used in the subject matter antenna design hardware.

The subject matter antenna design hardware has two different types of connectors (140), which include connector protrusion (144) or connector hole (145) according to the purpose of use. Thus, while the connector (140) having connector hole (145) can be screwed to the cells or the conductive ground plane (150), the connector (140) having the connector protrusion (144) can be used by engaging the connector protrusions (144) to the cells or the conductive ground plane (150). The interlocking connectors (140) having the connector protrusion (144) can be attached and detached practically without the need for screwing every time due to their property of contacting the connector protrusions (144). The connectors (140) can be contacted to the cells or conductive ground plane (150) or RF circuit boards prepared for different purposes by engaging nuts into the connector hole (145) and screwing these nuts on the mounting surface, or by interlocking the connector protrusions (144) of interlocking connectors (140) on the mounting surface or directly soldering or adhesive bonding or welding on the mounting surface.

Apart from the state of the art connectors (240), the interlocking connector (140) model has one or more than one connector protrusion (144). The connector protrusion (144) ensures that ground of the connector contacts the conductive ground plane (150) or the conductive cell when the connector (140) is connected to the conductive ground plane (150) or the conductive cell. By means of these connector protrusions (144), the connector (140) and the conductive ground plane (150) or the connector (140) and the conductive cell (110) mechanically contact with each other. Thus, connection is secured both mechanically and electrically.

Figure 14:
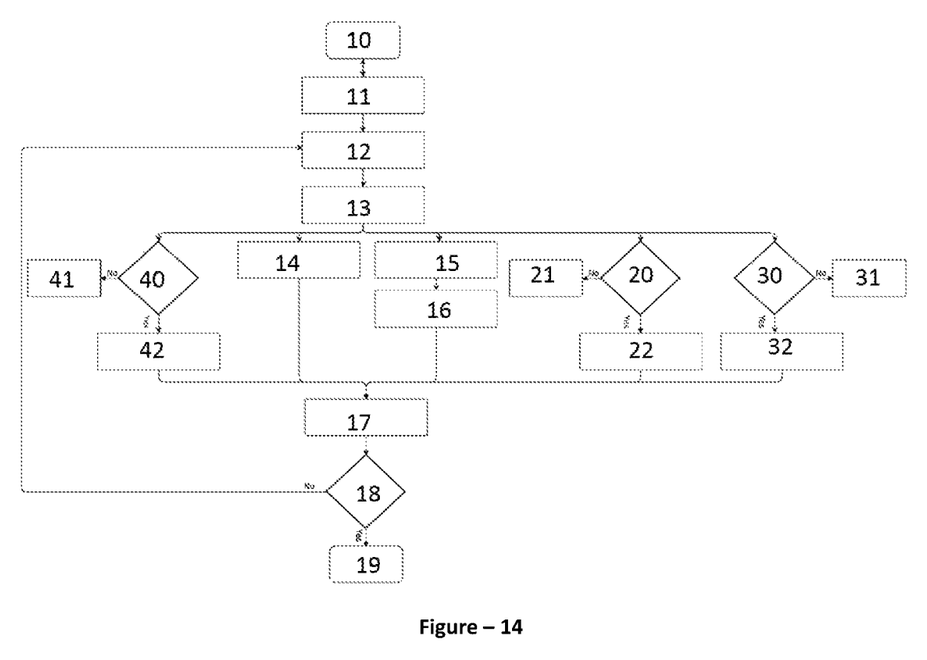
FIG. 14; The drawing showing the flow diagram of the subject matter antenna design hardware and antenna design method.

When it is intended to form an antenna by the subject matter antenna design hardware, the following method is used. First, antenna requirements are determined (10). Antenna type is determined according to the antenna requirements (11). Calculations are carried out according to antenna type and requirements (12). According to the calculations carried out, the cell types and the number of conductive cell (110), dielectric cell (120), electromagnetic absorber cell, and conductive ground plane (150), which are to be used, are determined (13). In some antenna designs, it is possible to omit using one or more of the conductive cell (110), the dielectric cell (120), the electromagnetic absorber cell and the conductive ground plane (150). The conductive cells (110), number of which is determined, are placed according to the determined antenna structure (14).

In the process step of "according to the calculations carried out, the cell types and the number of conductive cell (110), dielectric cell (120), electromagnetic absorber cell, and conductive ground plane (150), which are to be used, are determined (13)", separate determination for each conductive cell (110), dielectric cell (120), electromagnetic absorber cell, conductive ground plane (150) is conducted and the placement can also be performed by not using one or more of dielectric cell (120), electromagnetic absorber cell, conductive ground plane (150).

For this reason, it is checked whether the conductor ground plane (150) is used (20). If the conductive ground plane (150) is not used, it is not placed (21). If the conductive ground plane (150) is used, it is placed (22).

It is checked if the electromagnetic absorber cell is used (30). If the electromagnetic absorber cell is not used, it is not placed (31). If the electromagnetic absorber cell is used, it is placed (32).

It is checked if the dielectric cell (120) is used (40). If the dielectric cell (120) is not used, it is not placed (41). If the dielectric cell (120) is used, it is placed (42).

The connector (140) is selected (15). The selected connector (140) is mounted (16). It is measured whether the antenna structure meets the antenna requirements or not (17). If the antenna requirements are met, the design is completed (19). It is checked whether the antenna requirements are met or not (18), and if not, the processes are repeated by returning to the process step of making calculations according to the antenna type and antenna requirements (12).

Figure 7:
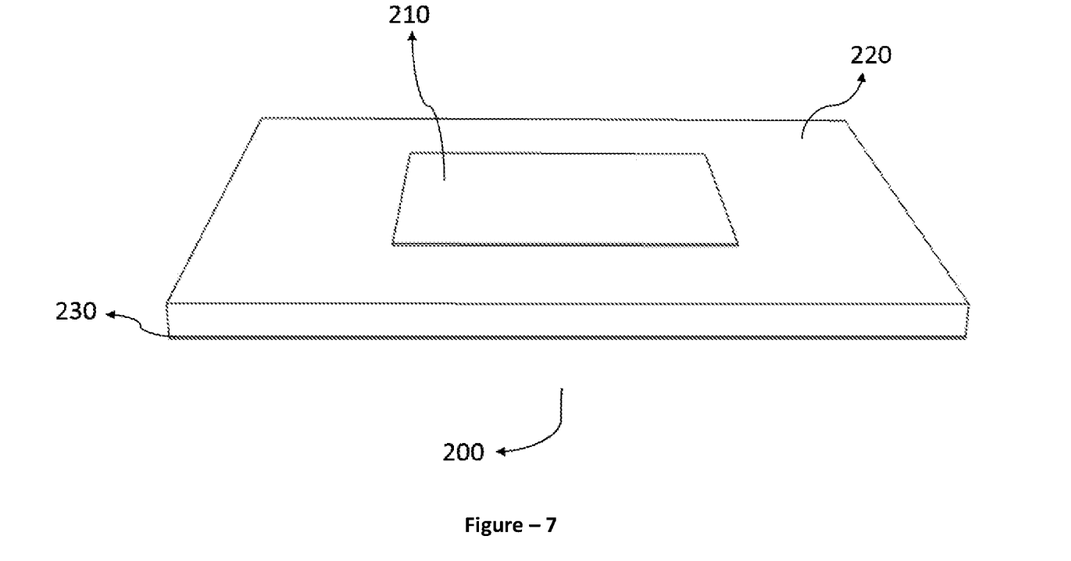
FIG. 7; The drawing showing the perspective view of patch antenna design used in the state of the art.
Figure 8:
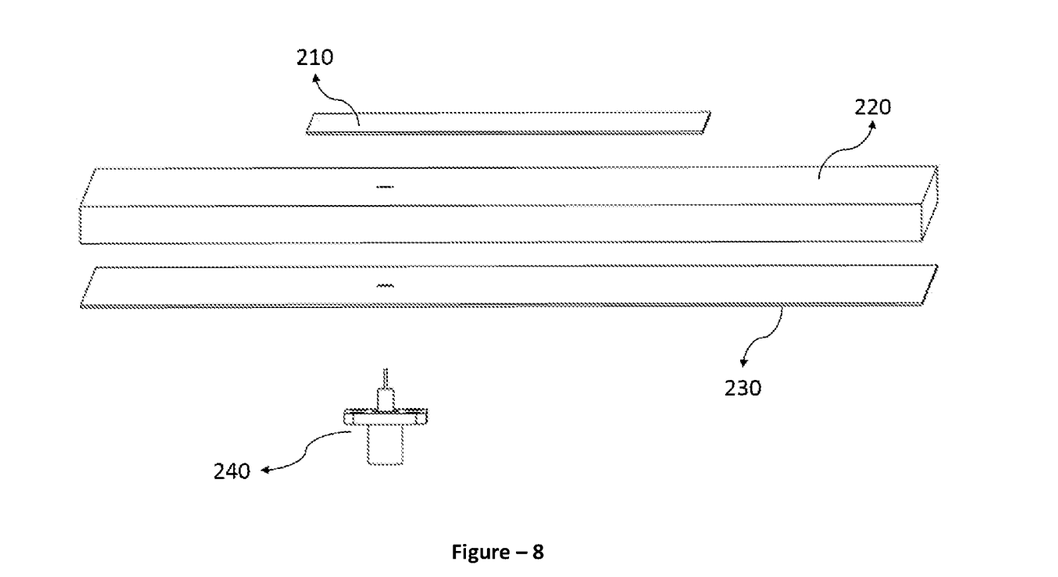
FIG. 8; The drawing showing the exploded perspective view of patch antenna design used in the state of the art.
Figure 9:
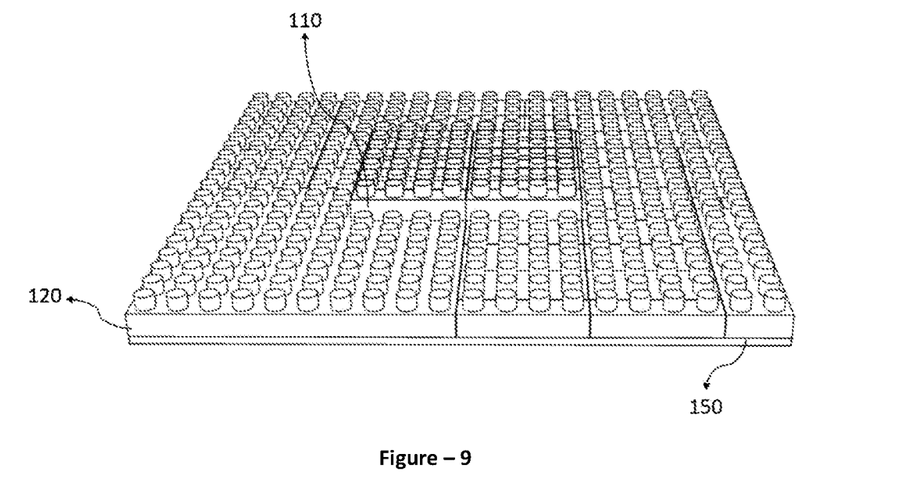
FIG. 9; The drawing showing the upper perspective view of patch antenna design obtained by the subject matter antenna design hardware.
Figure 10:
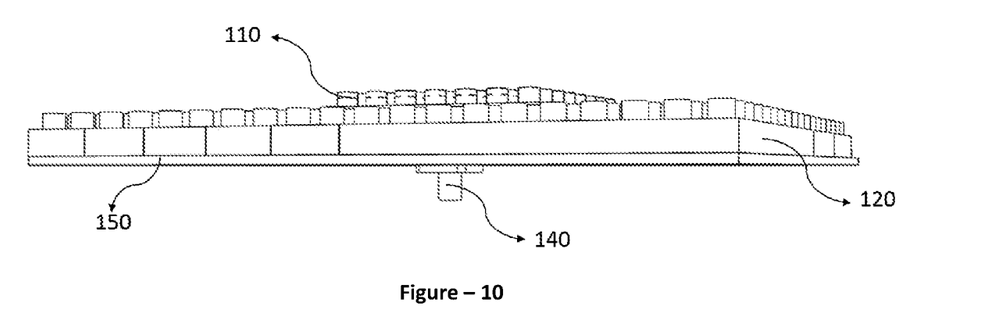
FIG. 10; The drawing showing the bottom perspective view of patch antenna design obtained by the subject matter antenna design hardware.

In an exemplary use of the subject matter antenna design hardware, the state of the art antenna design shown in FIG. 7 and FIG. 8 can be obtained as shown in FIG. 9 and FIG. 10. There are conductive cells (110) on top layer, dielectric cells (120) under it, and conductive ground plane (150) under it and connector (140) at the bottom of patch antenna designed by antenna design hardware shown in FIG. 9 and FIG. 10. The patch (210) of the patch antenna used in the State of the Art and the patch antenna dielectric (220) located under it and used in the state of the art and the patch antenna ground plane (230) used in the state of the art, which are shown in FIG. 7 and FIG. 8, consist of one-piece.

To change the operating frequency or gain of antenna shown in FIG. 9 and FIG. 10, new conductive cells (110) or dielectric cells (120) can be added, removed, replaced or one, several or all of the dielectric cells (120) can be replaced with materials with different dielectric constant. Thus, the specifications of the antenna designed or formed by the subject matter antenna design hardware can be changed very quickly. In addition, antenna design hardware is applicable for many types of antennas.

Figure 12:
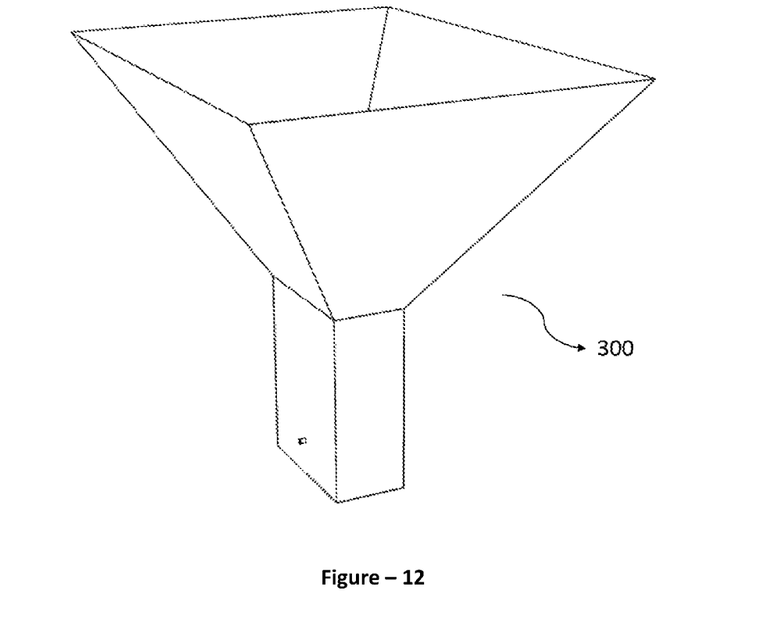
FIG. 12; The drawing showing the perspective view of horn antenna design used in the state of the art.
Figure 13:
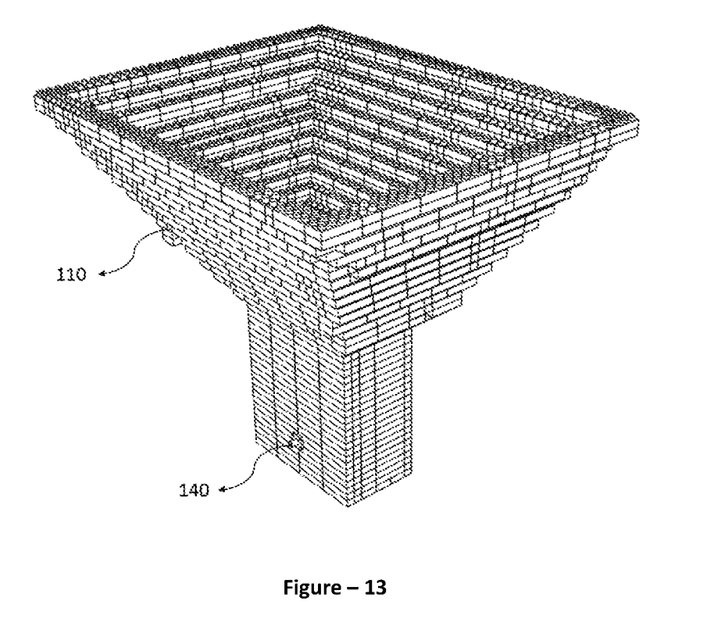
FIG. 13; The drawing showing the perspective view of horn antenna design obtained by the subject matter antenna design hardware.

The horn antennas (300) used in the state of the art shown as an example in FIG. 12 can be obtained with the antenna design hardware. The horn antenna built by the antenna design hardware shown in FIG. 13 consists of conductive cells (110) and connector (140). Different from the state of the art horn antennas (300), the antenna structure is built of cells. One of the biggest advantages of the cell structure is to be able to instantaneously change the gain of the antenna by increasing the number of outwardly extending conductive cells (110) thus extending the aperture of the antenna, or decreasing the number of outwardly extending conductive cells (110) thus reducing the aperture size of the antenna. Furthermore, horn antennas working at different frequencies can also be built by removing the detachable conductive cells (110) by hand or by the help of a tweezer or a disassembly apparatus and installing the same antenna structure at different dimensions. Since the state of the art horn antennas (300) are one piece, a different antenna must be made for each gain or half power beam width or frequency value. The antenna design hardware can easily achieve the desired antenna specifications by its cell structure.

Antenna building and designing by combining the conductive cells (110), dielectric cells (120), and electromagnetic absorber cells by the subject matter antenna design hardware provide working flexibility both to antenna designers and to antenna users. By combining the conductive cell (110), the dielectric cell (120) and the electromagnetic absorber cells, the desired geometry can be formed three-dimensionally. Instantaneous changes can be seen from the screen of antenna analyze device (network analyzer).

Instead of producing many prototypes to achieve the final electromagnetic specifications of the antenna, by means of the subject matter antenna design hardware, many different antennas can be built by using conductive cells (110), dielectric cells (120) and electromagnetic absorber cells. This method ensures both to make antenna design without using simulation programs and to build prototype antenna when antenna simulation programs are used. Performing antenna design using conductor cell (110), dielectric cell (120) and electromagnetic absorber cell without using antenna simulation programs reduces the number of process steps in conventional antenna design process. Similar to that, building the physical structure, which is designed in antenna simulation programs, by using conductive cells (110), dielectric cells (120) and electromagnetic absorber cells can eliminate the prototype and final product production costs of the antenna. Furthermore, a booklet or a software program can be created with the measurement results or calculation results of many different antenna types at different frequencies and different dimensions. Thus, antenna users who do not have antenna design knowledge and do not have an antenna analyze device will be able to build the antenna having specifications that they desire by following the guide on how to build the antenna with the desired specifications.

For example, when the design of the state of the art patch antenna (200) shown in FIG. 7 is made by the state of the art method, first the equations (1), (2) and (3) are used.

$$w = \frac{c}{2f_0\sqrt{\frac{\varepsilon_r + 1}{2}}} \quad (1)$$

$$\varepsilon_{\mathit{eff}} = \frac{\varepsilon_r + 1}{2} + \frac{\varepsilon_r - 1}{2}\left[\frac{1}{\sqrt{1 + \left(12\frac{h}{w}\right)}}\right] \quad (2)$$

$$L = \frac{c}{2f_0\sqrt{\varepsilon_{\mathit{eff}}}} - 0.824h\left(\frac{(\varepsilon_{\mathit{eff}} + 0.3)\left(\frac{w}{h} + 0.264\right)}{(\varepsilon_{\mathit{eff}} - 0.258)\left(\frac{w}{h} + 0.8\right)}\right) \quad (3)$$

In the equation number (1), c indicates the velocity of light, $f_0$ indicates center frequency at which antenna is desired to operate, $\varepsilon_r$ indicates dielectric constant to be used on antenna and w indicates width of the patch. w is calculated by entering c, $f_0$ and $\varepsilon_r$ values in this formula.

In the equation number (2), $\varepsilon_r$ indicates dielectric constant to be used on antenna, $\varepsilon_{\mathit{eff}}$ indicates effective dielectric constant of dielectric material to be used on antenna, h indicates height of dielectric material and w indicates width of the patch. $\varepsilon_{\mathit{eff}}$ is calculated by entering $\varepsilon_r$, h and w in this formula.

In the equation number (3), c indicates the velocity of light, $f_0$ indicates center frequency at which antenna is desired to operate, $\varepsilon_{\mathit{eff}}$ indicates effective dielectric constant of dielectric material to be used on antenna, h indicates height of dielectric material and w indicates width of the patch and L indicates length of the patch. L is calculated by entering c, $f_0$, $\varepsilon_{\mathit{eff}}$, h and w in this formula.

Dielectric material selection is made according to $\varepsilon_r$ dielectric constant and material thickness (h). The state of the art patch antenna dielectric (220) is located in the middle of the copper coated layers of the electronic circuit board. The process is conducted by chemical, engraving etc. methods such that the length (L) and the width (w) of copper plate at one side of the electronic circuit board have the dimensions calculated via equations numbers (1), (2) and (3). By this way, the dimensions of the state of the art patch (210) are obtained. The other surface of the copper plate is the state of the art patch antenna ground plane (230). A hole is perforated from ground plane to the state of the art patch (210) and thus it is ensured that the state of the art connector (240) passes through it. The chassis of the state of the art connector (240) is soldered to the state of the art patch antenna ground plane (230); inner conductor of the state of the art connector (240) is soldered to the state of the art patch (210). Thus, the antenna that is intended to operate at desired frequencies is obtained. Antenna reflection coefficient is measured to observe the operating frequency range. It may be required to change the dimensions of antenna in case of a shift from the intended operating frequency, and to change the location of the state of the art connector (240) in case of not being able to reach the desired reflection coefficient. In this case, the processes should be performed again to a new copper plate by chemical, engraving etc. methods, and mounting of the connector and measurement should be made again. This cycle continues until the desired reflection coefficient is obtained at the desired frequency. After the antenna reaches the desired frequency range, the radiation pattern measurements are carried out. When the desired results are obtained in the radiation pattern measurements, the design is completed.

Figure 11:
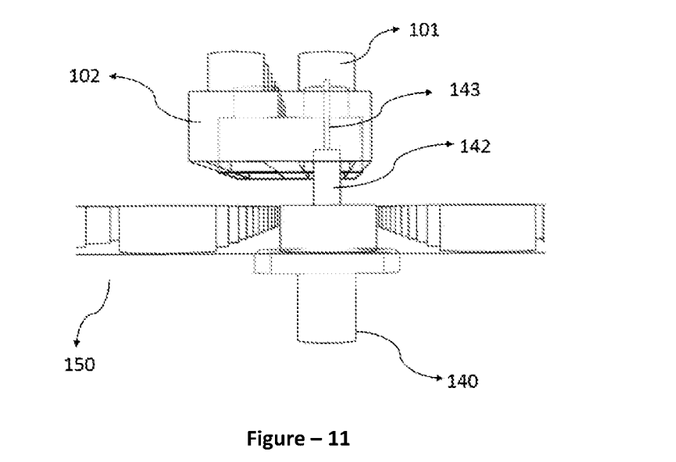
FIG. 11; The drawing showing the connection of subject matter antenna design hardware cell and the connector.

The same antenna with the antenna design hardware that is subject of the invention is designed as shown in FIG. 9 and FIG. 10. The values of $\varepsilon_r$ and h are selected from the dielectric cells (120) already present in the hardware. Antenna length (L) and antenna width (w) are calculated using the equations numbers (1), (2) and (3). The conductive ground plane (150) is placed at the bottom. Depending on the dimensions, the conductive ground plane (150) may consist of one-piece or more than one piece. The dielectric cells (120) with the values of $\varepsilon_r$ and h used at calculations are mounted manually over the conductive ground plane (150). Conductive cells (110) are placed on the dielectric cells (120). Inner conductor (143) of the connector is manually engaged to a conductive cell (110) such that the connector chassis is engaged to conductive ground plane (150), as shown in FIG. 11. Operation frequency and reflection coefficient value of antenna can be observed by measuring its reflection coefficient. In case of a shift from the intended operating frequency, antenna dimensions can be changed by manually adding or removing cells. In case the desired reflection coefficient cannot be reached, the connector (140) can also be manually relocated. When the ideal location of the connector (140) is determined, the design is completed by performing radiation pattern tests.

If the patch length (L) and the patch width (w) obtained using equations (1), (2) and (3) do not correspond to the multiples of the cell dimensions, then the closest dimensions are used. Thereby, all cells are mounted and the reflection coefficient is measured. If the desired values are not obtained, it is experimented to reach the desired frequency value by adding or removing the conductive cells (110). If it is still not reached, in this case, the desired frequency value is reached by replacing one, several or all of dielectric cells (120) with the dielectric cells (120) having different dielectric constant ($\varepsilon_r$) existing in the antenna design hardware. This method enables to make design at desired frequencies independent from design limitations of the conductive cell (110) dimensions.

Similar to antennas, passive microwave structures such as power dividers, couplers, filters, impedance transformers and magic tees are designed via electromagnetic simulation programs and measured with antenna analyze device (network analyzer). These structures are a part of microwave trainings. These passive components can be designed and built with antenna design hardware. Antenna design hardware is capable of building both microstrip and waveguide components with its cells.

In CEM (computational electromagnetics) software programs, when the user draws a solid structure in CAD environment, the software discretizes the structure into small pieces, called "mesh cells". The software uses numerical methods to solve electric and magnetic fields at each mesh cell. The user gets the results of the meshed structure while they see the solid structure in CAD (Computer Aided Design) drawing. Depending on the solution method, these cells can be in many different geometric shapes. The mesh cell dimensions are generally selected as wavelength over 20 or wavelength over 10 in order to reach realistic results comparing to the measurements of the fabricated antennas.

The cells in antenna design hardware is similar to "mesh cells" in CEM software programs. When the mesh cell geometry and dimensions are the same in antenna design hardware and CEM software programs, the results need to be similar.

A specific electromagnetic software which is able to draw the pre-defined cells of antenna design hardware is an optional element of antenna design hardware based on this principle. The users can select the pre-defined drawings of cells in the interface of the software program, build the antenna with the cells in CAD interface and simulate with the computer electromagnetic methods. Apart from the state of the art computer electromagnetic methods, this method has either the same mesh cell sizes with the hardware cells of the antenna design hardware or the pre-defined discretization points for each cell. This ensures that, apart from the simulation (computational) programs working for simulating a random structure, this specific software calculates the pre-defined geometries with predefined mesh cells. This method provides its users to practically observe the results of the antenna design hardware in computer environment.

The invention claimed is:

1. An antenna design hardware which allows users to realize antenna design and to form an antenna physically in any geometry they desire, characterized in that, antenna design hardware comprises:
    a plurality of electrically conductor conductive cells (110) each cell comprising at least one cell protrusion (101) and a cell body (102), each cell acts as a single conductor plate electromagnetically at RF frequencies and the cells are configured to contact or not to contact each other although being mechanically separate, and to operate by not contacting or by contacting each other from one or more points or all along the surface of the cell body (102) or by contacting the cell protrusion (101),
    a plurality of dielectric cells (120) each cell has a dielectric permittivity, the permittivity of the plurality of cells may be different, such that the cells are configured to have different dielectric permittivities at the same layer or different layers within one antenna to operate at all interval frequencies, and where the frequencies at which the antenna can operate are not limited to the step interval of the cell dimensions, namely to increasing the size of the antenna by at least one cell size, and which has three dimensional geometrical structure, and which acts as a single dielectric plate electromagnetically at RF frequencies by contacting or not contacting each other although being mechanically separate,
    a plurality of electromagnetic absorber cells acting as a single absorber plate electromagnetically at RF frequencies by contacting or not contacting each other although being mechanically separate, having three dimensional geometrical structure and configured for absorbing electromagnetic waves,
    a plurality of connectors (140) said connectors having either one or more connector protrusions (144) thereon or one or more connector holes which allows the connectors (140) to be removed or mounted from/on a conductive ground plane (150) of the plurality of ground planes or one of the plurality of the conductive cells,
    a plurality of conductive ground planes (150) acting as a single conductor plate electromagnetically at RF frequencies and configured for contacting or not contacting each other although being mechanically separate, said plurality of conductive ground planes each having a three dimensional geometrical structure, and being configured to be used as one or more than one according to requirements in the design of the antenna.

2. An antenna design hardware according to claim 1 characterized in that: antenna design hardware comprises the plurality of conductive cells (110), the plurality of dielectric cells (120), the plurality of electromagnetic absorber cells, the plurality of conductive ground planes (150) which are configured to be used to build antennas into more than one type according to operating frequency band, polarization, impedance, gain, size, weight, half-power beam width, side lobe level and back lobe level requirements.

3. An antenna building method by using the antenna design hardware according to claim 2 characterized in that the method comprises the process steps of:
    determining antenna requirements (10),
    determining antenna type according to determined antenna requirements (11),
    performing calculations according to antenna type and requirements (12),
    determining the cell types and the number of conductive cell (110), dielectric cell (120), electromagnetic absorber cell, and conductive ground plane (150) which are to be used according to the calculations (13),
    checking if the conductive ground plane is used (20),
    checking if the electromagnetic absorber cell is used (30),
    checking if the dielectric cell is used (40),
    placing the conductive cells (110) a number of which is determined according to the determined antenna structure (14),
    selection of the connector (140) (15),
    mounting the selected connector (140) (16),
    measuring whether the antenna structure meets the antenna requirements (17),
    checking whether the antenna requirements are met or not (18),
    completing the design when the measurement result fulfills the antenna requirements (19),
    the measurement result does not fulfill the antenna requirements, returning back to the step of "performing the calculations according to antenna type and requirements (12)".

4. An antenna building method by using the antenna design hardware according to claim 1 characterized in that the method comprises the process steps of:
- determining antenna requirements (10),
- determining antenna type according to determined antenna requirements (11),
- performing calculations according to antenna type and requirements (12),
- determining the cell types and the number of conductive cells (110), dielectric cells (120), electromagnetic absorber cells, and conductive ground planes (150) which are to be used according to the calculations (13),
- checking if at least one conductive ground plane of the plurality of ground planes is used (20),
- checking if at least one electromagnetic absorber cell of the plurality of absorber cells is used (30),
- checking if at least one dielectric cell of the plurality of the dielectric cells is used (40),
- placing the conductive cells (110), a number of which is determined according to the determined antenna structure (14),
- selection of the connector (140) (15),
- mounting the selected connector (140) (16),
- measuring whether the antenna structure meets the antenna requirements (17),
- checking whether the antenna requirements are met or not (18),
- completing the design when the measurement result fulfills the antenna requirements (19),
- when the measurement result does not fulfill the antenna requirements, returning back to the step of "performing the calculations according to antenna type and requirements (12)".

5. An antenna building method according to claim 4 characterized in that, the antenna building method by the antenna design hardware comprises: the process step that "if the conductive ground plane (150) is not used according to antenna requirements, it is not placed (21)" within the process steps of "checking if the conductive ground plane (150) is used (20)".

6. An antenna building method according to claim 4 characterized in that, the antenna building method by the antenna design hardware comprises: the process step that "if the conductive ground plane (150) is used according to antenna requirements, it is placed (22)" within the process steps of "checking if the conductive ground plane (150) is used (20)".

7. An antenna building method according to claim 4 characterized in that, the antenna building method by the antenna design hardware comprises: the process step that "if the electromagnetic absorber cell is not used, it is not placed (31)" within the process steps of "checking if the electromagnetic absorber cell is used (30)".

8. An antenna building method according to claim 4 characterized in that, the antenna building method by the antenna design hardware comprises: the process step that "if the electromagnetic absorber cell is used, it is placed (32)" within the process steps of "checking if the electromagnetic absorber cell is used (30)".

9. An antenna building method according to claim 4 characterized in that, the antenna building method by the antenna design hardware comprises: the process step that "if the dielectric cell is not used, it is not placed (41)" within the process steps of "checking if the dielectric cell (120) is used (40)".

10. An antenna building method according to claim 4 characterized in that, the antenna building method by the antenna design hardware comprises: the process step that "if the dielectric cell is used, it is placed (42)" within the process steps of "checking if the dielectric cell (120) is used (40)".

11. An antenna design hardware according to claim 1, characterized in that: each of the plurality of the conductive cells (110), dielectric cells (120), and electromagnetic absorber cells comprise a cell protrusion to connect each other by interlocking.

12. An antenna design hardware according to claim 1, characterized in that: each of the plurality of ground planes comprises a protrusion (151) ensuring an interlocking connection of a ground plane to a conductive cell (110), a dielectric cell (120), and electromagnetic absorber cell.

13. An antenna design hardware according to claim 1, characterized in that: antenna design hardware includes a plurality of conductive cells (110) having one or more conductivity values, each having a single value.

14. An antenna design hardware according to claim 1, characterized in that: the conductive cells (110), the dielectric cells (120), the electromagnetic absorber cells and the conductive ground planes (150) can be connected to each other by one or more of the methods of interlocking, screwing, bonding, soldering and welding.

15. An antenna design hardware according to claim 1, characterized in that: its capabilities are not limited to antennas, but also covers other passive electromagnetic structures as waveguide or microstrip components consisting of power dividers, couplers, filters, impedance transformers and/or magic tee.

* * * * *